(12) United States Patent
Johansson

(10) Patent No.: US 6,340,618 B1
(45) Date of Patent: Jan. 22, 2002

(54) RF POWER TRANSISTOR

(75) Inventor: Ted Johansson, Djursholm (SE)

(73) Assignee: Telefonaktiebolaget LM Ericsson (Publ) (SE)

( * ) Notice: Subject to any disclaimer, the term of this patent is extended or adjusted under 35 U.S.C. 154(b) by 0 days.

(21) Appl. No.: 09/572,399

(22) Filed: May 16, 2000

(30) Foreign Application Priority Data

May 17, 1999 (SE) ............................................. 9901771

(51) Int. Cl.⁷ .................... H01L 21/331; H01L 21/8228
(52) U.S. Cl. ...................................... 438/309; 438/330
(58) Field of Search ................................ 438/309, 313, 438/323, 326, 330, 340, 335, 120, 189, 202, 203, 204, 205

(56) References Cited

U.S. PATENT DOCUMENTS

| 3,597,640 A | 8/1971 | Kubinec ..................... 307/303 |
| 4,801,867 A | 1/1989 | Suzuki ..................... 324/73 R |
| 5,329,156 A | * 7/1994 | Bartlow ..................... 257/579 |
| 5,414,296 A | * 5/1995 | Bartlow ..................... 257/579 |
| 5,684,326 A | * 11/1997 | Johansson et al. ........... 257/582 |
| 5,821,620 A | 10/1998 | Hong ..................... 257/751 |

FOREIGN PATENT DOCUMENTS

EP 0 810 503 A1 12/1997

OTHER PUBLICATIONS

Erlandsson, T.; International–Type Search Report; Search Request No. SE99/00616; App. No. SE9901771–7; Apr. 5, 2000, pp. 1–3.

H. F. Cooke, *Microwave Transistors: Theory and Design*, PROC, IEEE, vol. 59, pp. 1163–1181, Aug. 1971.

S. M. Sze, *Physics of Semiconductor Devices*, 2nd Ed., pp. 150–151, John Wiley & Sons, Inc., 1981.

R. Allison, *Silicon Bipolar Microwave Power Transistors*, IEEE Trans. Microwave Theory & Techniques, vol. MTT–27 No. 5, pp. 415–422, 1979.

* cited by examiner

*Primary Examiner*—David Nelms
*Assistant Examiner*—David Nhu
(74) *Attorney, Agent, or Firm*—Jenkens & Gilchrist, a professional Corporation

(57) ABSTRACT

A method for manufacturing a silicon bipolar power high frequency transistor device is disclosed. A transistor device according to the present method is also disclosed. The transistor device assures conditions for maintaining a proper BV$_{CER}$ to avoid collector emitter breakdown during operation. According to the method an integrated resistor is arranged along at least one side of a silicon bipolar transistor on a semiconductor die which constitutes a substrate for the silicon bipolar transistor. The integrated resistor is connected between the base and emitter terminals of the silicon bipolar transistor. The added integrated resistor is a diffused p$^+$ resistor on said. semiconductor die or a polysilicon or NiCr resistor placed on top of the isolation layers. In an interdigitated transistor structure provided with integrated emitter ballast resistors the added resistor or resistors will be manufactured in a step simultaneously as producing the ballast resistors.

6 Claims, 2 Drawing Sheets

RF POWER TRANSISTOR

FIELD OF THE INVENTION

The inventions related to silicon bipolar RF-power transistors, particularly discrete transistors using high voltage supply for use in cellular base stations, TV-transmitters etc.

DESCRIPTION OF THE RELATED ART

Bipolar transistors for high-frequency power amplification are widely used in output parts of communications system. High-frequency transistors were first fabricated in germanium in late fifties but were soon replaced by silicon bipolar transistors in the beginning of the sixties, and have since then dominated the RF-power area. Por cellular radio, bipolar transistors are dominating in the base station output amplifiers, and can deliver great performance up to at least 2 GHz and 100 W output power, with good stability, availability and price. Other technologies of choice for this class of applications are GaAs MESFETs and laterally diffused MOS-transistors (LD-MOS). There is a strong driving force to further improve the existing technology, as well as to explore new types of devices, because of the rapidly expanding telecommunications market. Computer tools presently available are not yet capable to predict detailed behavior or performance in real applications, and performance optimization is made using mainly experimental methods.

Power transistors are especially designed to deliver high output power and high gain. Manufacturing process, device parameters, layouts and package have been carefully tuned for this purpose. The devices need to meet numerous detailed requirements for breakdown voltages, DC gain or transconductance, capacitance, RF gain, ruggedness, noise figure, input/output impedance, distortion etc. The operating frequency range from several hundred MHz into the GHz region. Power transistors operate at large signal levels and high current densities. About 1 W output power is a starting level where special considerations have to taken into account, and may serve as a loose definition of a power device, compared to a "normal", IC-type of transistor.

A bipolar transistor is usually designed using only one n-type (i.e. NPN) device on a single die. A collector layer (n⁻ epi) is epitaxially deposited on an n⁺ substrate. The base and emitter are formed by diffusion or ion implantation at the top of the epitaxial layer. By varying the doping profiles, it is possible to achieve different frequency and breakdown voltage characteristics. The output power requirements range up to several hundred watts, sometimes even kilowatts, and the high output power is achieved by paralleling many transistor cells on a single die, and paralleling several dies in a package. The packages often have large gold-plated heat sinks to remove heat generated by the chip.

For the DC-data, the $BV_{CEO}$ (collector-emitter breakdown voltage with open base) is the most limiting parameters, traditionally designed to be higher than $V_{cc}$ (24–28 V supply voltage is a common range for this class of devices). A well-known empiric formula for the relationship of the transistor breakdown voltages and the current gain, $\beta$ or $h_{FE}$, states:

$$BV_{CEO} = \frac{BV_{CBO}}{\sqrt[n]{\beta}} \quad (1)$$

where $BV_{CEO}$ already has been defined, $BV_{CBO}$ is the collector-base breakdown voltage with open emitter, and n is an empirical constant, usually between 2.5 and 4.5, related to the nature of the BC-junction breakdown. For a given epi doping and device design (constant n), $BV_{CBO}$ will be constant, and then $BV_{CEO}$ and $\beta$ are directly correlated: higher $\beta$ gives lower $BV_{CEO}$. n can be improved by different doping profile tricks, to ensure that nature of the $BV_{CBO}$ is as close as possible to the one-dimensional junction case.

To obtain a device capable of high output power, the doping of the collector layer should be selected as high as possible, thus suppressing high current phenomena, such as the Kirk effect. A highly doped collector layer also has the advantage of having a smaller depletion region, which makes it possible to select a thinner epi layer, with less parasitic resistance and better high-frequency performance, without being limited by thickness-limited breakdown. The problem is that increased collector doping inevitably leads to a low $BV_{CBO}$ and thus a low $BV_{CEO}$, according to equation (1).

To obtain a device capable of high power gain, the $\beta$ must not be too low. The power gain $G_P$ can be described by the following relationship:

$$G_p(f) \approx \frac{\beta}{\sqrt{1+\beta^2\left(\frac{f}{f_{max}}\right)^4}} \quad (2)$$

where $\beta$ is the zero-frequency gain ($h_{FE}$) and $f_{max}$ is the maximum oscillation frequency, or the frequency where the power gain is equal to unity. A plot olf equation (2), $h_{FE}$ versus $G_P$, is shown in FIG. 1 for different $f_{max}$ values at f=1 GHz. From this plot it can be concluded that a high $f_{max}$ and not too low $\beta$ are detrimental for a good RF power gain.

Because of the relations between output power via collector doping, power gain via $\beta$ and $BV_{CEO}$, if a low $BV_{ceo}$ can be accepted, this will lead to significant improvements of the most important parameters for RF power transistors.

Because Of this, data sheets may specify $BV_{CER}$ instead of $BV_{CEO}$. A small resistor is connected between the base and emitter when designing the amplifier, to assure that the base is never fully open. If the resistor is small enough, $BV_{CER}$ will approach $BV_{CES}$, which is close (slightly lower) to $BV_{CBO}$.

The characteristics for the different collector breakdown voltages are shown in FIG. 2.

As apparent from the previous section, if $BV_{CEO}$ is lower than $V_{cc}$, an external resistor, which occupies additional space on a circuit board, must be used to assure safe operation of the device. The value is dependent on the size of the device, and an optimal value may be problematic to find, and requires some experience to not destroy the device while finding the value. If, in any way, the resistor disconnects from the circuit, e.g. during evaluations, bad soldering etc., the transistor may be damaged.

SUMMARY

By integrating a resistor on the bipolar RF-power transistor semiconductor die, between base and emitter in accordance to the present invention, it will be assured that the conditions to obtain the $BV_{CER}$ always will be fulfilled.

Therefore, integrating the resistor necessary for $BV_{CER}$ into the semiconductor die results in that the use of transistors with an intrinsic low $BV_{CEO}$ is simplified.

A method according to the present invention is set forth by the independent claim 1 and the dependent claims 2–6. Further a transistor device according to the present invention is set forth by the independent claim 7 and further embodiments are set forth by the dependent claims 8–10.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 5:
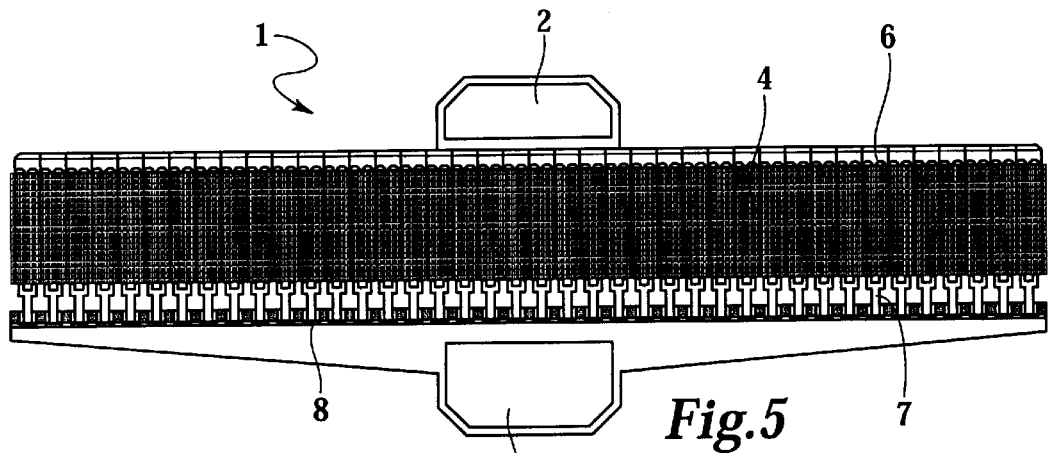
FIG. 5 illustrates a typical RF-power transistor layout.

A typical bipolar transistor layout is shown in FIG. 5. The transistor structure is vertical with the collector contact on the silicon substrate's backside. The cross-section of the upper part of the structure is shown in FIG. 6.

The majority of modern RF bipolar power transistors of today contains a large number of paralleled transistor segments to obtain a high power capacity by distributing a large amount of current, reducing parasitics and providing heat spreading. The most common layout scheme, the interdigitated layout, consists of alternating fingers of base and emitter regions in parallel, connected by ribbons of metalization on top of the silicon. A typical transistor cell layout with an active area 4 is demonstrated in FIG. 5. Reference number 2 indicates a base terminal bonding pad and 3 indicates the emitter terminal bonding pad while as already noted the backside of the substrate forms the collector terminal pad.

If the bias supply of a transistor is held constant and temperature increases, then Vbe decreases and collector current increases. If there is no other influence, this condition may cause the transistor to go into "thermal run away" wherein a current is reached at which the transistor fails. One method to avoid this is to use a resistor in series with the emitter. As collector current increases Vbe is reduced and therefore the base current is reduced. The best place to locate this emitter resistor is on the silicon chip together with each active transistor in the array. In this manner the inductance in series with the emitter resistor is kept to a minimum. This emitter resistor is mostly referred to as the ballast resistor. In the array of FIG. 5 the ballasting in noted by reference number 8.

Figure 6:
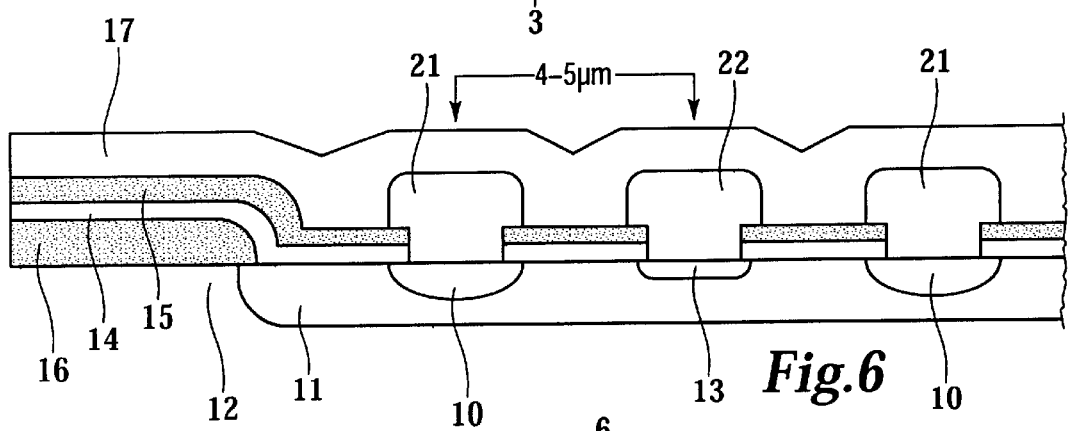
FIG. 6 is a cross section of the RF-power transistor shown in FIG. 5.

FIG. 6 illustrates a more detailed schematic cross section of a typical interdigitated cell of FIG. 5. Reference number 11 refers to a p-type base layer on top of an n⁻ epi substrate material 12. In the base region material is seen an n⁺ doped emitter area 13 and two p⁺ doped base contact areas 10. The base contact areas 10 are further contacted by metalizations 21 and the emitter contact area 13 is further contacted by a metalization 22. Pairs of the emitter metalizations are then combined by the forked terminal fingers 7 illustrated in FIG. 5. The metalized fingers 7 are via ballast resistors 8 connected to the emitter terminal bonding pad 3. Correspondingly the base metalizations are combined for connecting to the base terminal bonding pad, 2 at the upper portion of the structure according to FIG. 5. In the structure according to the cross section of FIG. 6 is also seen oxide layer 15 and 16 and a nitride layer 14 as well as a nitride passivation layer 17. FIGS. 5 and 6 demonstrate the use of a common silicon planar technology. In a typical 1 GHz technology the pitch defined as the emitter-to-base periodic distance is of the order 4–5 µm and the emitter and base openings are typically 1 to 1.5 µm wide. A silicide, e.g. PtSi, is often used in the emitter and base openings to lower the contact resistance and thus the parasitic base resistance. To further ensure a good diffusion barrier between metal and semiconductor material a multi-layered TiW/TiW(N)/TiW barrier may be used in accordance to the metalization scheme for microcircuit interconnections disclosed in our U.S. Pat. No. 5,821, 620, which is hereby incorporated by reference. There is no inter-device isolation and the whole silicon substrate constitutes the collector.

By integrating a further resistor on the bipolar RF-power transistor semiconductor die, between base and emitter, it will be assured that the conditions to obtain the proper BVCER always will be fulfilled.

Figure 1:
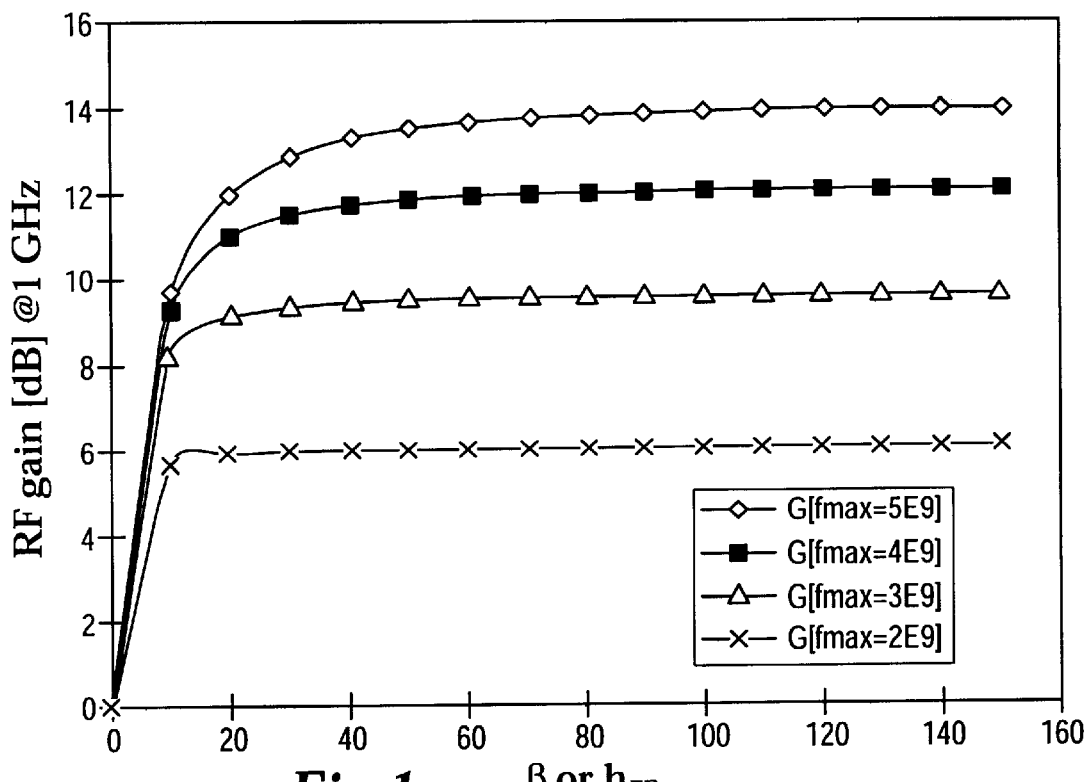
FIG. 1 illustrates the power (RF) gain at 1 GHz as a function of the DC gaina hFE and fmax.
Figure 2:
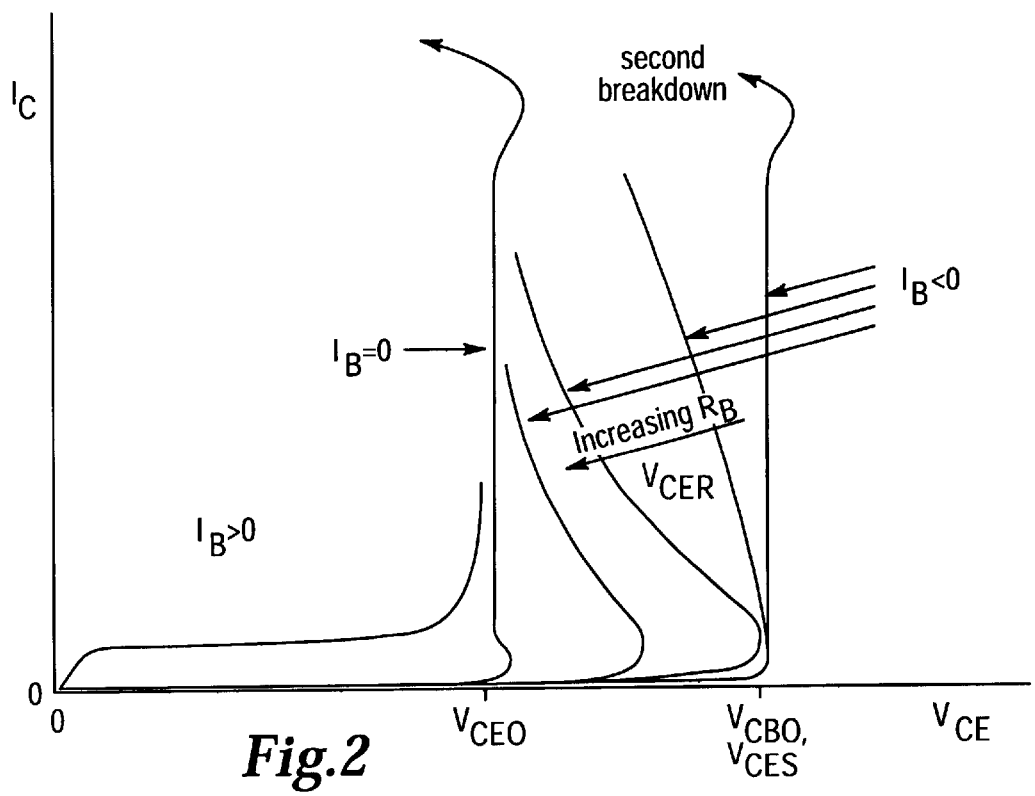
FIG. 2 illustrates characteristics for the different collector breakdown voltages.
Figure 3:
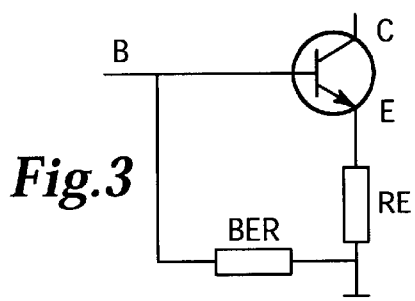
FIG. 3 illustrates schematically a first possibility of an external or integrated BE-resistor.
Figure 4:
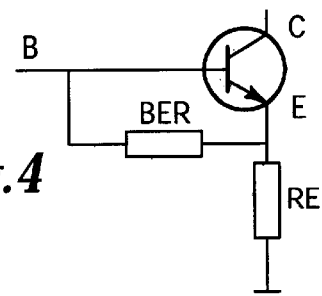
FIG. 4 illustrates schematically a second possibility of a fully integrated BE-resistor.

FIGS. 3 and 4 show the circuit diagram for the semiconductor die with integrated RBE, indicating two different possibilities, where circuitry of FIG. 3 will correspond to the preferred solution today with an external resistor.

Figure 7:
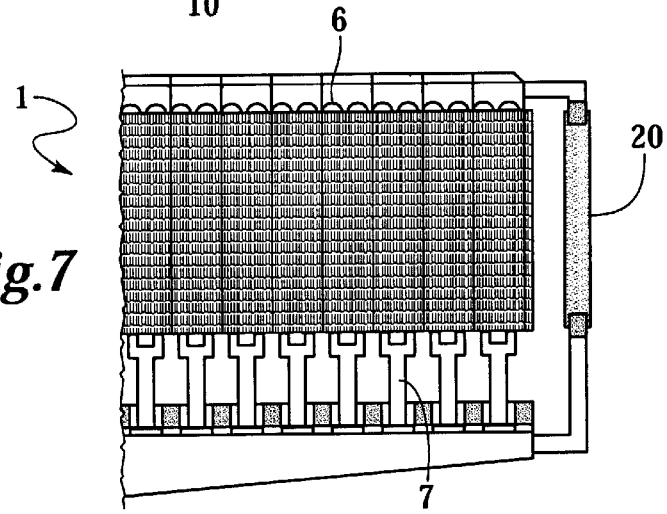
FIG. 7 illustrates in accordance with the present invention the adding of a BE-resistor into the layout according to FIG. 5.

An example how to add the BE-resistor 20 is demonstrated in FIG. 7. The resistor is connected to the base and emitter metalization, at least on one side, but preferably on both sides of the array structure (left and right side in FIG. 5). The embodiment of FIG. 7 represents the circuit of FIG. 3.

An integrated resistor on a semiconductor die can be formed using several different methods. The three most common are diffused resistors, polysilicon resistor and metal resistors, e.g. NiCr. Integration of distributed resistors between the active emitter areas and the emitter connection (emitter pad) is necessary for high voltage device operation, emitter ballasting as previously mentioned. Integration of other passive elements, such as capacitors, is also known.

The actual BE-resistor is formed by any of the above mentioned methods (diffused, poly, NiCr), but preferably using the same method as the compulsory emitter ballasting resistor. The resistor value will conveniently be selected by the size of the resistor area (size of the square between the terminals) and the doping. It is possible to use the same doping steps as for the ballasting resistor, which is ion-implanted with an adjustable dose, and usually with a mask, which is open only over resistor areas. However, as the ballasting resistor usually requires adjustments during the development phase for a new transistor or new applications, an additional mask for independently selecting the doping level for the BE-resistor (in combination with the layout) is beneficial for engineering purposes.

There will also be a tighter, quite advanced way to realize the BE-resistor within the transistor structure, at least for a transistor using polysilicon for emitter and base contacts, the resistor then also being polysilicon. In that case, the resistor will be connected corresponding to FIG 4, but care must be taken for not degrading the effect of the RE-ballasting.

When the added BE resistor is diffused p⁺ on the n⁻ collector epi, it must be assured that the base/emitter voltage is always lower than the collector voltage, but this is normally the case. When applying polysilicon or NiCr resistors those are placed on top of the isolation layers 15, 16 (left part of FIG. 6), so any voltage relative the collector substrate can be used. These resistors are also beneficial, because the important BC-capacitance is lower than for a diffused resistor.

A typical value for the BE-resistor for the layout used in this example is 10 Ω.

One slight drawback with the solution is that it increases the base-emitter bias current, which will affect the efficiency, e.g. collector efficiency defined as $\eta=P_{RF,out}/P_{Dc,in}$. The increase is quite small and the devices used in the typical application field are not especially demanding on the efficiency requirements, compared to e.g. devices for low-voltage handheld applications. However, the important benefit is the general protection obtained by the integrated BE resistor, which is always present to assure conditions for maintaining a proper value of $BV_{CER}$ to avoid collector to emitter breakdown.

In a further embodiment of the present invention utilizing integrated BE resistors in the interdigitated structure, the individual emitter ballast resistors are further provided with a bypass capacitor on the chip for increasing the gain of the RF power transistor.

It will be understood by those skilled in the art that various modifications and changes may be made to the present invention without departure from the scope thereof, which is defined by the appended claims.

REFERENCES

H. F. Cooke, "Microwave Transistors: Theory and Design", *Proc. IEEE*, vol. 59, p. 1163, August 1971.

See e.g. S. M. Sze, in "Physics of Semiconductor Devices", $2^{nd}$ Ed., p.151, John Wiley & Sons, Inc., 1981.

R. Allison, "Silicon Bipolar Microwave Power Transistors", *IEEE* Trans. Microwave Theory & Techniques., Vol. MTT-27, No. 5, p. 415, 1979.

T. Johansson, L. Leighton, U.S. Pat. No. 5,684,326 issued Nov. 4, 1997.

S.-H. Hong, U.S. Pat. No. 5,821,620 issued Oct. 13, 1998.

What is claimed is:

1. A method for manufacturing a silicon bipolar power high frequency transistor assuring conditions for maintaining a proper $BV_{CER}$ to avoid collector emitter breakdown, comprising the steps of arranging an integrated resistor along at least one side of a silicon, bipolar transistor on a semiconductor die constituting substrate for said silicon bipolar transistor; and connecting said integrated resistor between base and emitter terminals of said silicon bipolar transistor.

2. The method according to claim 1, comprising the further step of creating said integrated resistor as a diffused $p^+$ resistor on said semiconductor die.

3. The method according to claim 2, comprising the further step of producing said integrated resistor between base and emitter terminals of said bipolar transistor simultaneously as producing at least one emitter ballast resistor.

4. The method according to claim 3, comprising the further step of introducing an bypass capacitor for each said at least one emitter ballast resistor integrated in said semiconductor die forming said silicon bipolar transistor.

5. The method according to claim 1, comprising the further step of creating said integrated resistor as a polysilicon or NiCr resistor placed on top of isolation layers.

6. The method according to claim 5, comprising the further step of producing said integrated resistor between base and emitter terminals of said silicon bipolar transistor simultaneously as producing at least one emitter ballast resistor.

* * * * *

UNITED STATES PATENT AND TRADEMARK OFFICE
CERTIFICATE OF CORRECTION

PATENT NO. : 6,340,618 B1
DATED : January 22, 2002
INVENTOR(S) : Johansson

It is certified that error appears in the above-identified patent and that said Letters Patent is hereby corrected as shown below:

Column 1
Line 15, replace "Por" with -- For --
Line 58, replace "empiric" with empirical --

Column 2,
Line 29, replace "olf" with -- of --

Column 4,
Line 3, replace "layer" with -- layers --

Signed and Sealed this

Eighteenth Day of June, 2002

Attest:

JAMES E. ROGAN
Attesting Officer     Director of the United States Patent and Trademark Office